United States Patent
Peng et al.

(10) Patent No.: US 10,424,866 B1
(45) Date of Patent: Sep. 24, 2019

(54) WATERPROOF CONNECTOR

(71) Applicant: F TIME TECHNOLOGY INDUSTRIAL CO., LTD., New Taipei (TW)

(72) Inventors: Chang-Lin Peng, New Taipei (TW); Xin-Fu Liu, New Taipei (TW); Yen-Hua Huang, New Taipei (TW); Chih-Hsuan Tung, New Taipei (TW)

(73) Assignee: F TIME TECHNOLOGY INDUSTRIAL CO., LTD., New Taipei (TW)

( * ) Notice: Subject to any disclaimer, the term of this patent is extended or adjusted under 35 U.S.C. 154(b) by 0 days.

(21) Appl. No.: 16/225,863

(22) Filed: Dec. 19, 2018

(51) Int. Cl.
| | |
|---|---|
| *H01R 13/52* | (2006.01) |
| *H01R 13/40* | (2006.01) |
| *H01R 13/502* | (2006.01) |
| *H01R 13/73* | (2006.01) |
| *H05K 5/06* | (2006.01) |

(52) U.S. Cl.
CPC ......... *H01R 13/5202* (2013.01); *H01R 13/40* (2013.01); *H01R 13/502* (2013.01); *H01R 13/73* (2013.01); *H05K 5/06* (2013.01)

(58) Field of Classification Search
CPC .... H01R 13/5202; H01R 13/40; H01R 13/73; H01R 13/5221; H01R 13/5205
USPC ....................................................... 439/587
See application file for complete search history.

(56) References Cited

U.S. PATENT DOCUMENTS

| | | | | |
|---|---|---|---|---|
| 5,167,536 A | * | 12/1992 | Wang | H01R 13/7195 333/185 |
| 5,557,068 A | * | 9/1996 | Chung | H01R 13/6625 174/59 |
| 6,283,793 B1 | * | 9/2001 | Nakata | H01R 4/185 439/404 |
| 7,794,277 B1 | * | 9/2010 | Peng | H01R 24/42 439/607.01 |
| 8,083,544 B2 | * | 12/2011 | Chee | H01R 24/542 439/578 |
| 8,740,629 B1 | * | 6/2014 | Hall | H01R 13/6456 439/63 |
| 9,595,795 B2 | * | 3/2017 | Lane | H01R 24/38 |
| 9,774,138 B1 | * | 9/2017 | Peng | H01R 24/20 |
| 10,181,687 B1 | * | 1/2019 | Peng | H01R 12/714 |

(Continued)

*Primary Examiner* — Tulsidas C Patel
*Assistant Examiner* — Peter G Leigh
(74) *Attorney, Agent, or Firm* — Guice Patents PLLC

(57) ABSTRACT

A waterproof connector includes a base and a guiding seat. The base includes a seat. The seat includes a bottom plate and a guiding sleeve is connected to the bottom plate. A first waterproof sealing ring is disposed in the connection of the guiding sleeve and the bottom plate. A conductive member is disposed within the guiding sleeve. The conductive member extends through a first fixing seat. A second waterproof sealing ring allows the conductive member to extends therethrough and overlaps the first fixing seat. The second waterproof sealing ring has two grooves formed on two surfaces thereof. The conductive member extends through a second fixing seat, and the second fixing seat overlaps the second waterproof sealing ring. Finally the guiding seat is connected to the guiding sleeve. The guiding seat has a through groove, and the first waterproof sealing ring is sandwiched between an inner surface of the through groove and the outer surface of the guiding groove for the first waterproof element.

8 Claims, 5 Drawing Sheets

(56) References Cited

U.S. PATENT DOCUMENTS

| | | | |
|---|---|---|---|
| 2006/0019535 A1* | 1/2006 | Fukushima | H01R 13/5221 |
| | | | 439/587 |
| 2011/0244720 A1* | 10/2011 | Peng | H01R 24/44 |
| | | | 439/578 |
| 2013/0157505 A1* | 6/2013 | Sykes | H01R 9/05 |
| | | | 439/578 |
| 2016/0134048 A1* | 5/2016 | Kato | H01R 13/625 |
| | | | 439/587 |
| 2018/0159250 A1* | 6/2018 | Zhao | H01R 9/034 |
| 2018/0331471 A1* | 11/2018 | Zhang | H01R 13/639 |
| 2018/0358746 A1* | 12/2018 | Lin | H01R 13/6277 |

* cited by examiner

WATERPROOF CONNECTOR

BACKGROUND OF THE INVENTION

Field of the Invention

The invention relates to a connector, and more particularly to a waterproof connector providing double waterproof effect.

Description of the Related Art

Due to the rapid advancement of wireless communication technology, a coaxial connector is mounted on a mobile device, such as a mobile phone, in the design of the mobile device. When a signal cable is inserted into the coaxial connector, the antenna of the mobile device itself is disabled, and the mobile device is connected to an external antenna device.

In addition to providing stable signal transmission, the current coaxial connector needs to be able to adapt to different external use environments, as well as suddenly-changed environments, especially the environments affected by liquid or moisture, so that the waterproof is very important for the connector.

In the past, in considering the waterproof requirement, the conventional technology utilizes the silicone in the bonding position of the connector to protect the internal conductive circuit. However, since the silicone coating may create a gap, the waterproof effect was not as expected. Therefore, the subsequent conventional technical utilized waterproof gaskets for waterproof, and waterproof gaskets are provided at each joint position of the connector to modify the drawbacks of the silicone coating mentioned above.

However, the conventional technology utilizes the waterproof gasket as a waterproof means, and the waterproof gasket is directly sandwiched between the components so that the waterproof gasket is fixed at each connection position. However, the waterproof gasket is not easy to assemble or the position is easily moved, which directly affects the waterproof effect, and the waterproof gasket is easy to affect the connection of the connector and also affects the electrical conductivity of the connector when the waterproof gasket is assembled with the connector.

BRIEF SUMMARY OF THE INVENTION

The invention provides a waterproof connector having a plurality of waterproof sealing rings. The structure of the waterproof connector of the invention is easily to assemble and has waterproof effect. The waterproof connector in accordance with an exemplary embodiment of the invention includes a base comprising a seat comprising a plurality of rods and a bottom plate having a through hole, wherein the rods are disposed at corners of the bottom plate; a guiding sleeve connected to a surface of the bottom plate and communicating with the through hole; a first waterproof sealing ring disposed on the guiding sleeve and located in a connection position of the guiding sleeve and the bottom plate; a conductive member which is a rod disposed in the guiding sleeve, wherein the conductive member comprises a connecting end and a conductive end, and the connecting end protrudes from the bottom plate and the conductive end is within the guiding sleeve when the conductive member is mounted in the guiding sleeve; a first fixing seat having a first through hole through which the conductive member extends, wherein the first fixing seat has an outer diameter substantially equal to an inner diameter of the guiding sleeve so that the first fixing seat is fixed within the guiding sleeve and the conductive member is positioned; a second waterproof sealing ring comprising a hole through which the conductive member extends and two grooves formed on two end surfaces of the second waterproof sealing ring, wherein the second waterproof sealing ring overlaps the first fixing seat; a second fixing seat comprising a second through hole which the conductive member extends, wherein the second fixing seat has an identical size to that of the first fixing seat and overlaps the second waterproof sealing ring to position the conductive member, and the second waterproof sealing ring is sandwiched by the first fixing seat and the second fixing seat; and a guiding seat comprising a connecting groove formed on an end surface of the guiding seat and a through groove therein, wherein the connecting groove is joined to the bottom plate, and the guiding sleeve is received by the through groove.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
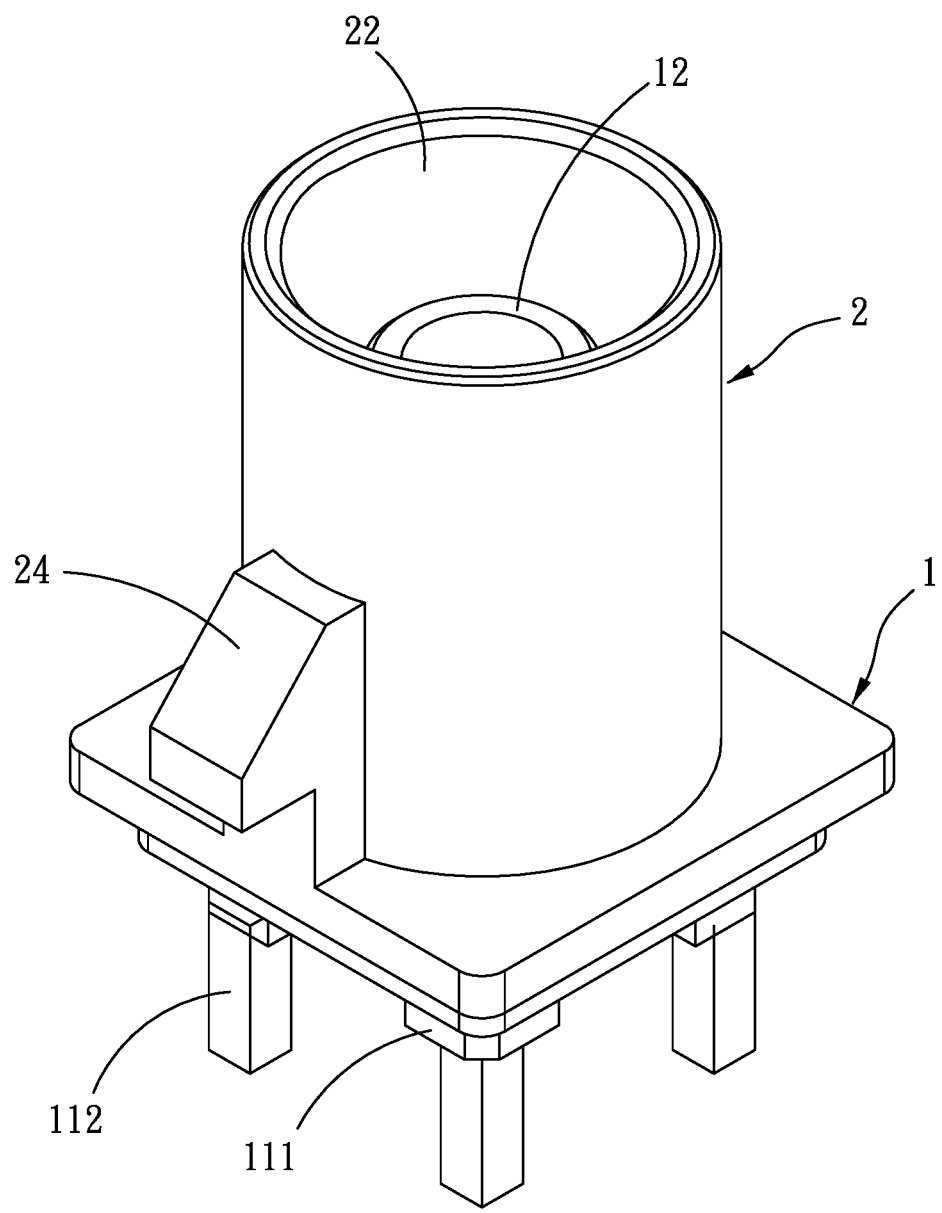
FIG. 1 is a perspective view of an embodiment of the waterproof connector of the invention.
Figure 2:
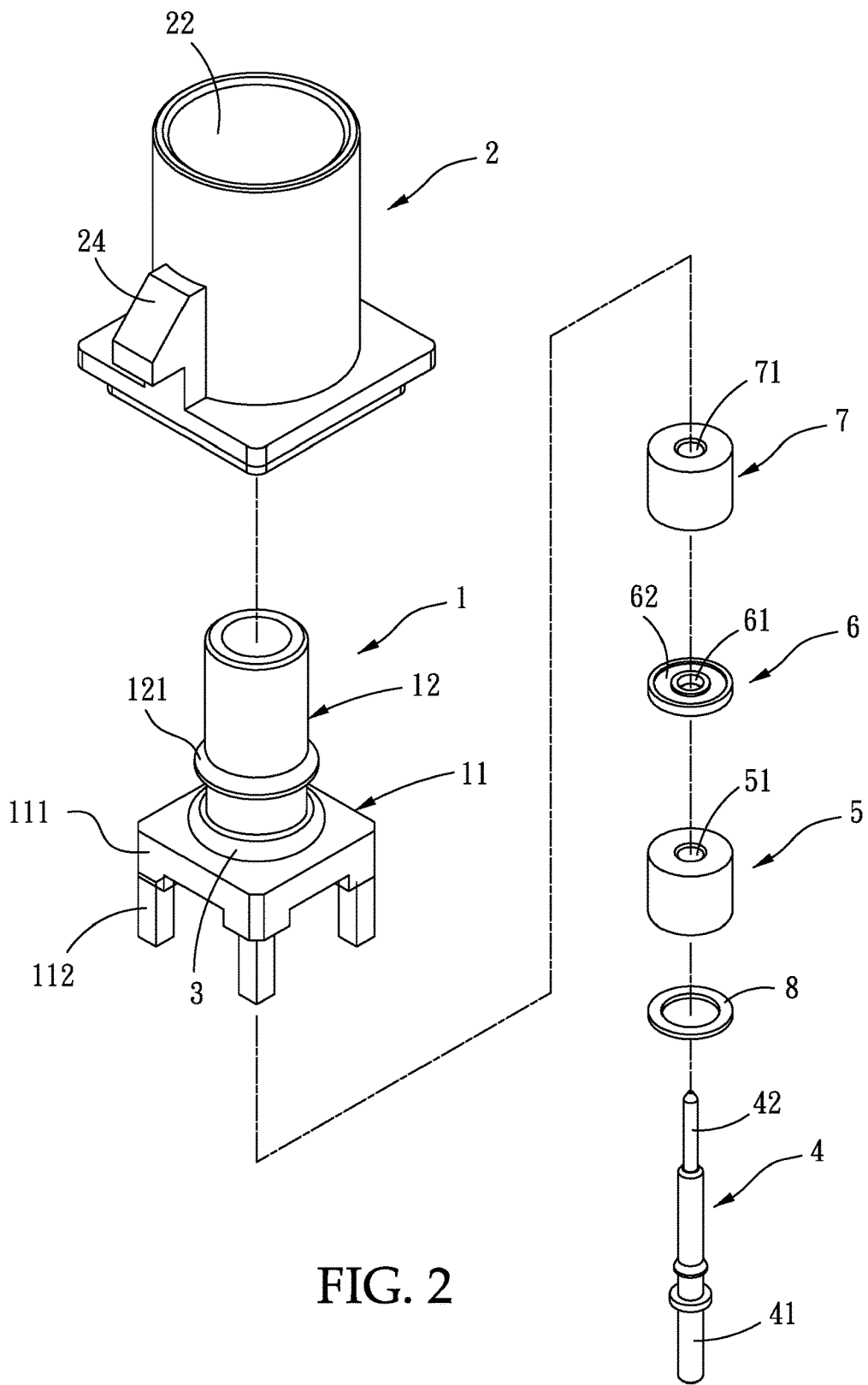
FIG. 2 is an exploded view of an embodiment of the waterproof connector of the invention.
Figure 3:
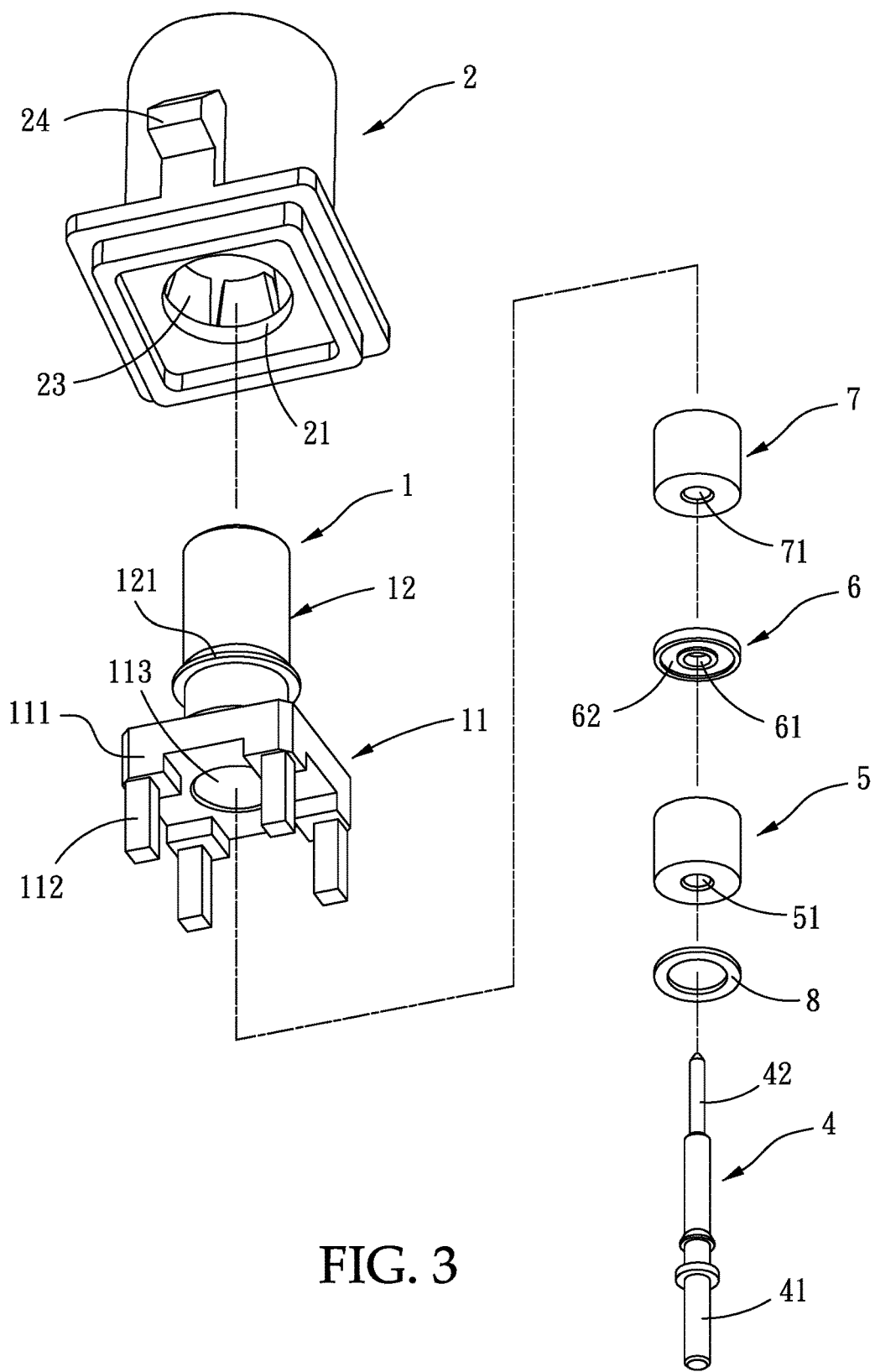
FIG. 3 is another exploded view of an embodiment of the waterproof connector of the invention.

Referring to FIGS. 1 and 2, the waterproof connector of the invention includes a base 1 and a guiding seat 2. The base 1 further includes a seat 11. The seat 11 has a bottom plate 111. A rod 112 is disposed on each corner of the bottom plate 111 to support the bottom plate 111 above a circuit board (not shown). This is the waterproof connector of this embodiment, but the waterproof connector of the invention is not limited thereto. A guiding sleeve 12 is connected to a surface of the bottom plate 111. The guiding sleeve 12 is hollow and cylindrical. The bottom plate 111 has a through hole 113. As shown in FIG. 3, the through hole 113 communicates with the guiding sleeve 12. A flange 121 is disposed on an outer periphery surface of the guiding sleeve 12. A first waterproof sealing ring 3 is disposed in a connection position of the guiding sleeve 12 and the bottom plate 111.

Figure 4:
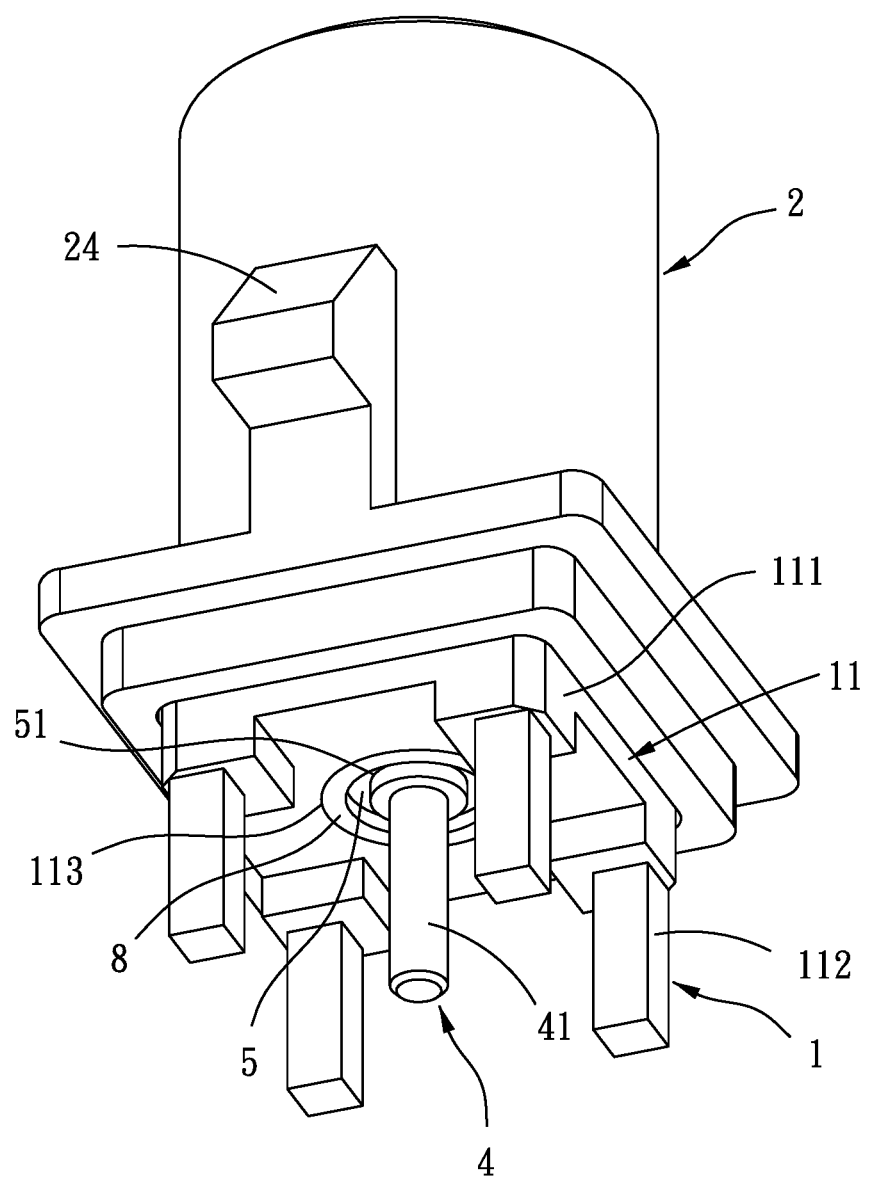
FIG. 4 is another perspective view of an embodiment of the waterproof connector of the invention.

Referring to FIG. 1 again, a conductive member 4 is disposed within the guiding sleeve 12. The conductive member 4 is a rod. The conductive member 4 includes a connecting end 41 and a conductive end 42. The connecting end 41 protrudes from the bottom plate 111 when the conductive member 4 is mounted in the guiding sleeve 12 as shown in FIG. 4, and the conductive end 42 is within the guiding sleeve 12. The conductive member 4 is disposed in a first fixing seat 5. The first fixing seat 5 is cylindrical and has a first through hole 51 formed on a center thereof. The conductive member 4 extends through the first through hole 51. The first fixing seat 5 has an outer diameter substantially equal to an inner diameter of the guiding sleeve 12 so that the first fixing seat 5 is fixed in the guiding sleeve 12 to aid the conductive member 4 being positioned. A second waterproof sealing ring 6 is disposed on the conductive member 4. The second waterproof sealing ring 6 has a hole 61 through which the conductive member 4 extends. The second waterproof sealing ring 6 overlaps the first fixing seat 5 when the conductive member 4 extends through the second waterproof sealing ring 6. Each of the end surface of the second waterproof sealing ring 6 has a groove 62 as shown in FIGS. 2 and 3. The conductive member 4 extends through a second fixing seat 7. The second fixing seat 7 has the same size as the first fixing seat 5. The second fixing seat 7 is cylindrical. The second fixing seat 7 has a second through hole 71 on a center thereof. The conductive member 4 extends through the second through hole 71. The second fixing seat 7 has an outer diameter substantially equal to the inner diameter of the conductive member 4 so that the second fixing seat 7 is fixed within the guiding sleeve 12 to aid the conductive member 4 being positioned. The second fixing seat 7 overlaps the second waterproof sealing ring 6, and the second waterproof sealing ring 6 is sandwiched by the first fixing seat 5 and the second fixing seat 7. The second waterproof sealing ring 6 is the second element for waterproof. The first fixing seat 5 has a fixing ring 8 disposed on a bottom thereof, and the fixing ring 8 is tightly fitted to the through hole 113 so as to fix the first fixing seat 5.

Figure 5:
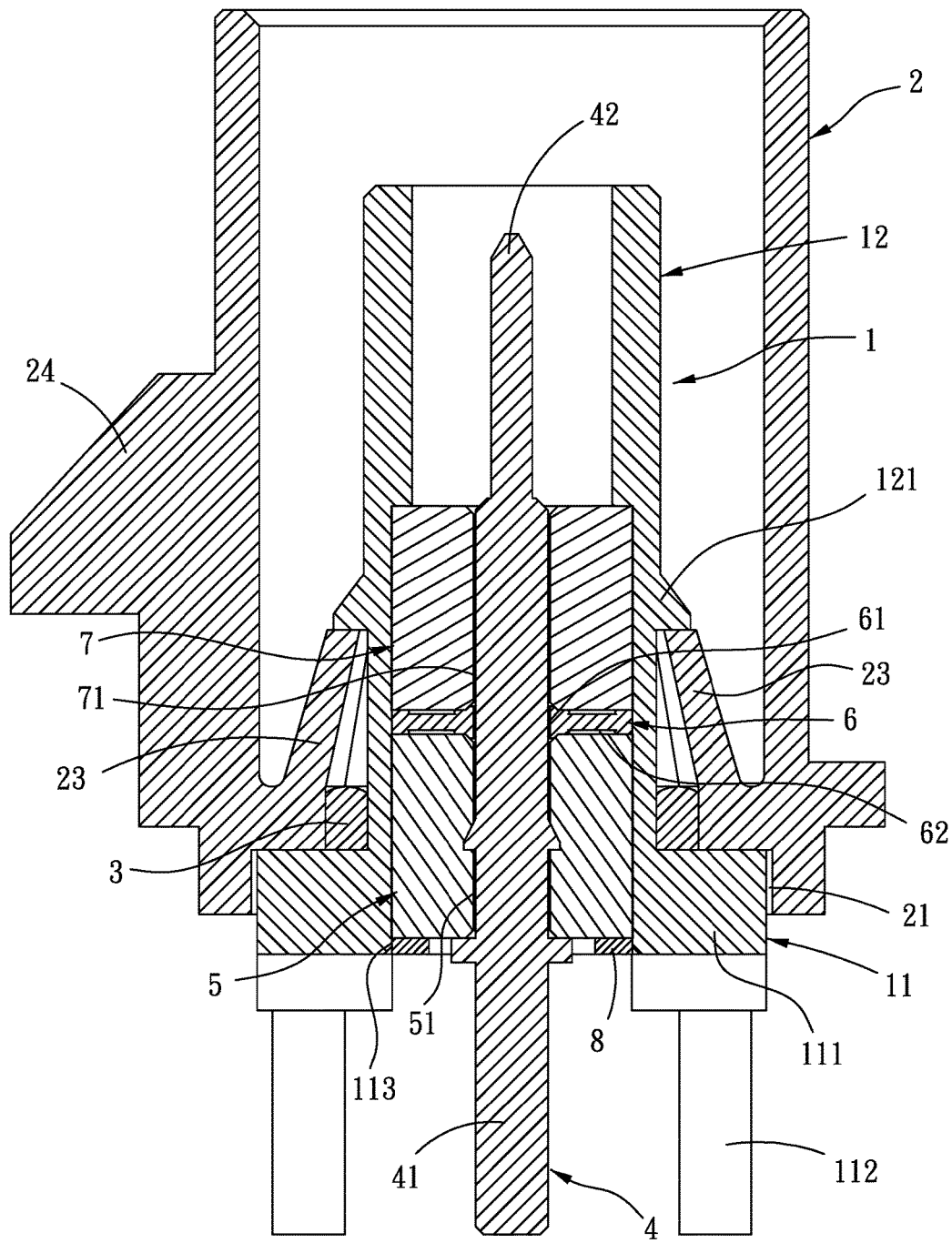
FIG. 5 is a cross sectional view of an embodiment of the waterproof connector of the invention.

Referring to FIG. 2, the guiding seat 2 is connected to the guiding sleeve 12. The guiding seat 2 is hollow and has a connecting groove 21. As shown in FIG. 3, the connecting groove 21 is circular. The connecting groove 21 is connected to the bottom plate 111 to position the base 1 and the guiding seat 2. The guiding seat 2 further has a through groove 22 for receiving the guiding sleeve 12 as shown in FIG. 5. When the guiding sleeve 12 is received in the through groove 22, the first waterproof sealing ring 3 is sandwiched between an inner surface of the through groove 22 and the outer periphery surface of the guiding sleeve 12 for serving as the first waterproof element. Several jaws 23 are disposed on an inner rim of the connecting groove 21, the jaws 23 are equally spaced to each other and inclined toward to an axis of the guiding seat 2, and the jaws 23 prop against the flange 121 when the guiding sleeve 12 is inserted into the through groove 22 so as to fix the guiding sleeve 12 relative to the through groove 22. The guiding seat 2 further includes a hook 24 disposed on an outer periphery surface of the guiding seat 2.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A waterproof connector, comprising:
a base comprising:
   a seat comprising a plurality of rods and a bottom plate having a through hole, wherein the rods are disposed at corners of the bottom plate;
   a guiding sleeve connected to a surface of the bottom plate and communicating with the through hole;
   a first waterproof sealing ring disposed on the guiding sleeve and located in a connection position of the guiding sleeve and the bottom plate;
   a conductive member which is a rod disposed in the guiding sleeve, wherein the conductive member comprises a connecting end and a conductive end, and the connecting end protrudes from the bottom plate when the conductive member is mounted in the guiding sleeve, and the conductive end is within the guiding sleeve;
   a first fixing seat having a first through hole through which the conductive member extends, wherein the first fixing seat has an outer diameter substantially equal to an inner diameter of the guiding sleeve so that the first fixing seat is fixed within the guiding sleeve and the conductive member is positioned;
   a second waterproof sealing ring comprising a hole through which the conductive member extends and two grooves formed on two end surfaces of the second waterproof sealing ring, wherein the second waterproof sealing ring overlaps the first fixing seat when the conductive member extends through the second waterproof sealing ring; and
   a second fixing seat comprising a second through hole which the conductive member extends, wherein the second fixing seat has a size identical to that of the first fixing seat and overlaps the second waterproof sealing ring to position the conductive member, and the second waterproof sealing ring is sandwiched by the first fixing seat and the second fixing seat; and
a guiding seat comprising a connecting groove formed on an end surface of the guiding seat and a through groove therein, wherein the connecting groove is joined to the bottom plate, and the guiding sleeve is received by the through groove.

2. The waterproof connector as claimed in claim 1, wherein the guiding sleeve is hollow and cylindrical.

3. The waterproof connector as claimed in claim 1, wherein the guiding sleeve comprises a flange disposed on an outer periphery of the guiding sleeve.

4. The waterproof connector as claimed in claim 3, wherein the guiding seat further comprises a plurality of jaws disposed on an inner surface of the connecting groove, the jaws are equally spaced to each other and inclined toward to an axis of the guiding seat, and the jaws prop against the flange when the guiding sleeve is inserted into the through groove.

5. The waterproof connector as claimed in claim 1, wherein the first fixing seat is cylindrical.

6. The waterproof connector as claimed in claim 1, wherein the connecting groove is circular.

7. The waterproof connector as claimed in claim 1, wherein the guiding seat further comprises a hook disposed on an outer periphery surface of the guiding seat.

8. The waterproof connector as claimed in claim 1, wherein the first fixing seat further comprises a fixing ring disposed on a bottom thereof, and the fixing ring is tightly fitted to the through hole.

* * * * *